(12) United States Patent
Moon et al.

(10) Patent No.: US 6,589,434 B2
(45) Date of Patent: Jul. 8, 2003

(54) METHOD FOR MANUFACTURING 3-D HORN ANTENNA USING EXPOSURE APPARATUS

(75) Inventors: Sung Moon, Namyangju (KR); Jong Yeon Park, Seoul (KR)

(73) Assignee: Institute of Science and Technology, Seoul (KR)

( * ) Notice: Subject to any disclaimer, the term of this patent is extended or adjusted under 35 U.S.C. 154(b) by 75 days.

(21) Appl. No.: 09/986,506

(22) Filed: Nov. 9, 2001

(65) Prior Publication Data

US 2003/0092268 A1 May 15, 2003

(51) Int. Cl.⁷ .............................. B44C 1/22; H01L 21/00
(52) U.S. Cl. ................ 216/2; 216/38; 216/88; 359/368; 438/692; 438/745
(58) Field of Search .................. 438/691, 692, 438/693, 745; 216/2, 38, 88, 89, 91; 156/345.48; 359/368, 384, 394

(56) References Cited

PUBLICATIONS

Sung MOON et al., "Fabrication of Thz Band Horn Shape Antenna", 2000 Fall Thesis Competition, Korea Electrical Study Association, p. 581–682, Nov. 25, 2000, along with an English language abstract.

*Primary Examiner*—William A. Powell
(74) *Attorney, Agent, or Firm*—Greenblum & Bernstein, P.L.C.

(57) ABSTRACT

The present invention relates to an exposure apparatus and a method for manufacturing 3-D horn antenna using the exposure apparatus. More particularly, it relates to a method for manufacturing a horn-shaped 3-D micro-structure antenna and an extremely low-speed, inclined-rotating, parallel exposure apparatus that makes it possible to manufacture the 3-D micro-structure antenna mentioned above.

12 Claims, 7 Drawing Sheets

METHOD FOR MANUFACTURING 3-D HORN ANTENNA USING EXPOSURE APPARATUS

BACKGROUND OF THE INVENTION

1. Field of the Invention

The present invention relates to an exposure apparatus and a method for manufacturing 3-D horn antenna using the exposure apparatus. More particularly, it relates to a method for manufacturing a horn-shaped 3-D micro-structure antenna and an extremely low-speed, inclined-rotating, parallel exposure apparatus that makes it possible to manufacture the 3-D micro-structure antenna mentioned above.

2. Description of the Related Art

A chuck of an exposure apparatus, which is a photo-processing apparatus for manufacturing a Micro-Electro-Mechanical System(MEMS), generally has a horizontal structure. However, it is difficult to construct a horn-shaped 3-D micro-structure antenna by using a chuck of an exposure apparatus having a horizontal structure.

And, it appears, by calculation, that the structure of an exposure apparatus to obtain parallel light to be exposed has a comparably high vertical structural shape.

FIG. 1 is a view illustrating the overall structure of a prior exposure system having horizontal structure by using mirror reflection. And FIG. 2 is a view showing an exposure simulation result of a horizontal-structure exposure apparatus.

Referring to FIG. 1, the system comprises numbers of reflecting mirrors, a fly eye lens(F.E.L), a plate lens, and a collimating lens.

However, in case of manufacturing a 3-D inclined structure using an ultraviolet lithographic process, which is a general MEMS process, the function of an antenna is insufficient because the homogeneity of the surface is considerably lowered as described in FIG. 2.

And, there exists a problem of securing a sufficient room for installing an exposure apparatus having a special structure to obtain parallel light in a general experimental room.

SUMMARY OF THE INVENTION

The present invention is proposed to solve the problems of the prior art mentioned above. It is therefore the object of the present invention to provide a novel method for manufacturing a horn-shaped 3-D micro-structure antenna.

It is another object of the present invention to provide a method of constructing an extremely low-speed, inclined-rotating, parallel exposure apparatus that makes it possible to manufacture the 3-D micro-structure antenna mentioned above.

It is yet another object of the present invention to provide a method of constructing an exposure apparatus having horizontal structure, instead of vertical structure, by using reflection of mirrors installed inside the mirror box of the exposure apparatus.

To achieve the object mentioned above, the present invention presents: (1) an exposure apparatus by which light is exposed by rotating a chuck, on which a mask and a wafer are united, with extremely low-speed in an inclined state, (2) a method of reducing the size of an exposure apparatus by constructing a horizontal-structure mirror box using reflection of mirrors installed inside, to overcome the comparably-high theoretical vertical length of the mirror box to obtain parallel light in the prior exposure apparatus, and (3) a method of manufacturing 3-D micro system using the exposure apparatus.

BRIEF DESCRIPTION OF THE DRAWINGS

FIG. 6a~FIG. 8f are views illustrating the manufacturing procedures of a horn-shaped 3-D micro-structure antenna in accordance with the present invention.

DESCRIPTION OF THE NUMERALS ON THE MAIN PARTS OF THE DRAWINGS

Figure 1:
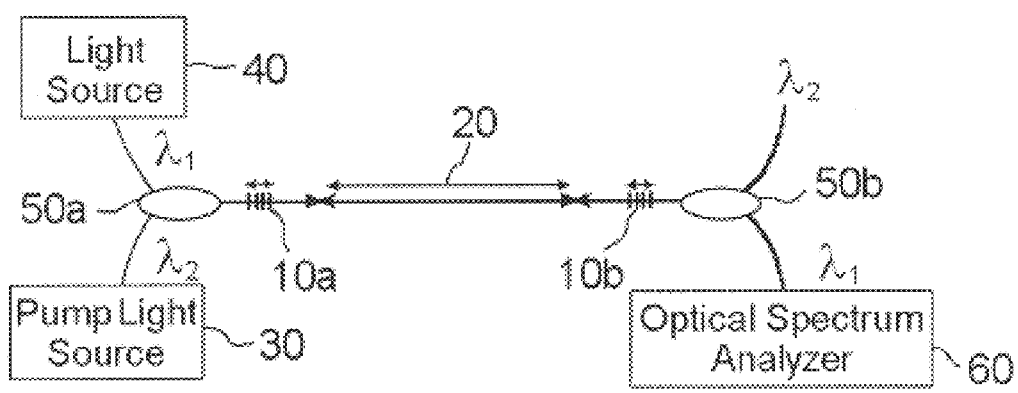
FIG. 1 is a view illustrating the overall structure of a prior exposure system having horizontal structure by using mirror reflection.
Figure 2:
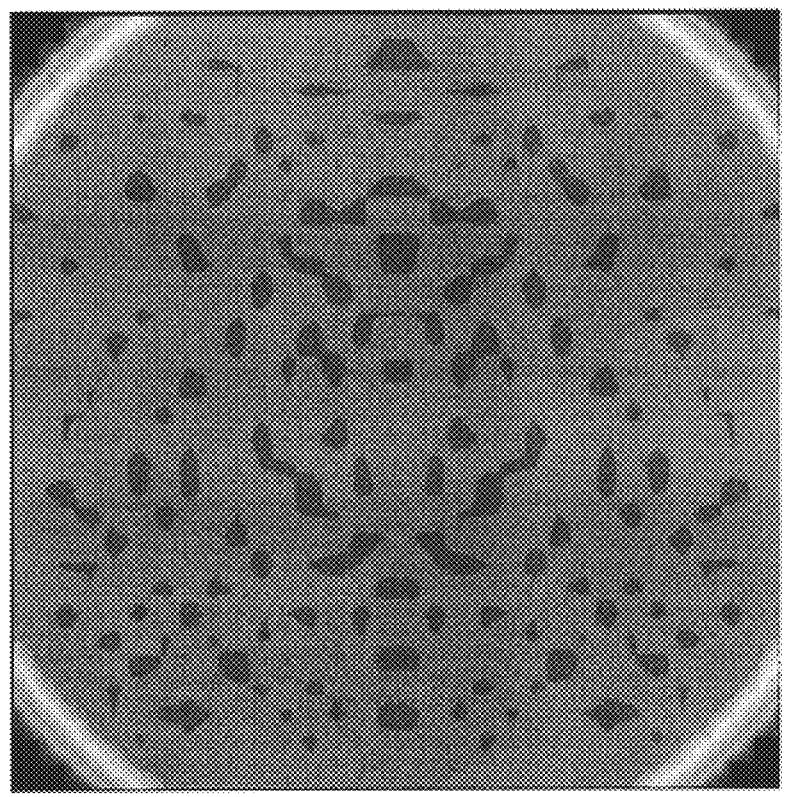
FIG. 2 is a view showing an exposure simulation result of a horizontal-structure exposure apparatus.

10: a power supply
20: a lamp cooler
30: a mirror box of exposure apparatus
40: a chuck
50: a motor
60: a vacuum device
70: a computer
100: a semiconductor substrate
102: a sacrificial oxide film
104: the first photosensitive film
106: an exposure mask
108: the first metal film
110: a micro-structural body
112: a polymer thick film
114: the second photosensitive film
116: a round
118: the second metal film
120: the third metal film
122: the third photosensitive film
124: the fourth metal film

DETAILED DESCRIPTION OF THE EMBODIMENTS

Hereinafter, referring to appended drawings, the structure and the operation procedures of the embodiments of the present invention are described in detail.

Figure 3:
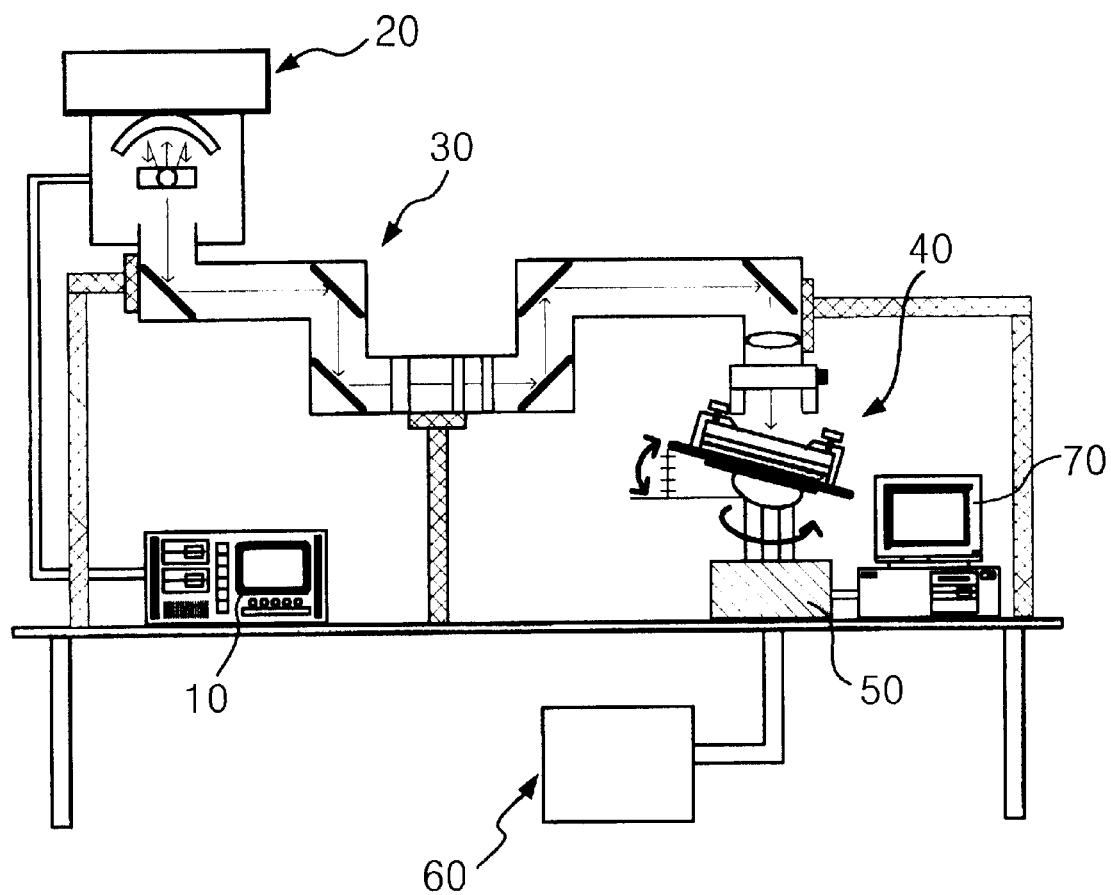
FIG. 3 is a view illustrating the overall structure of a mirror-reflection type, horizontal-structure, parallel exposure apparatus, in which an extremely low-speed, inclined-rotating, exposure chuck is installed, in accordance with the present invention.
Figure 4:
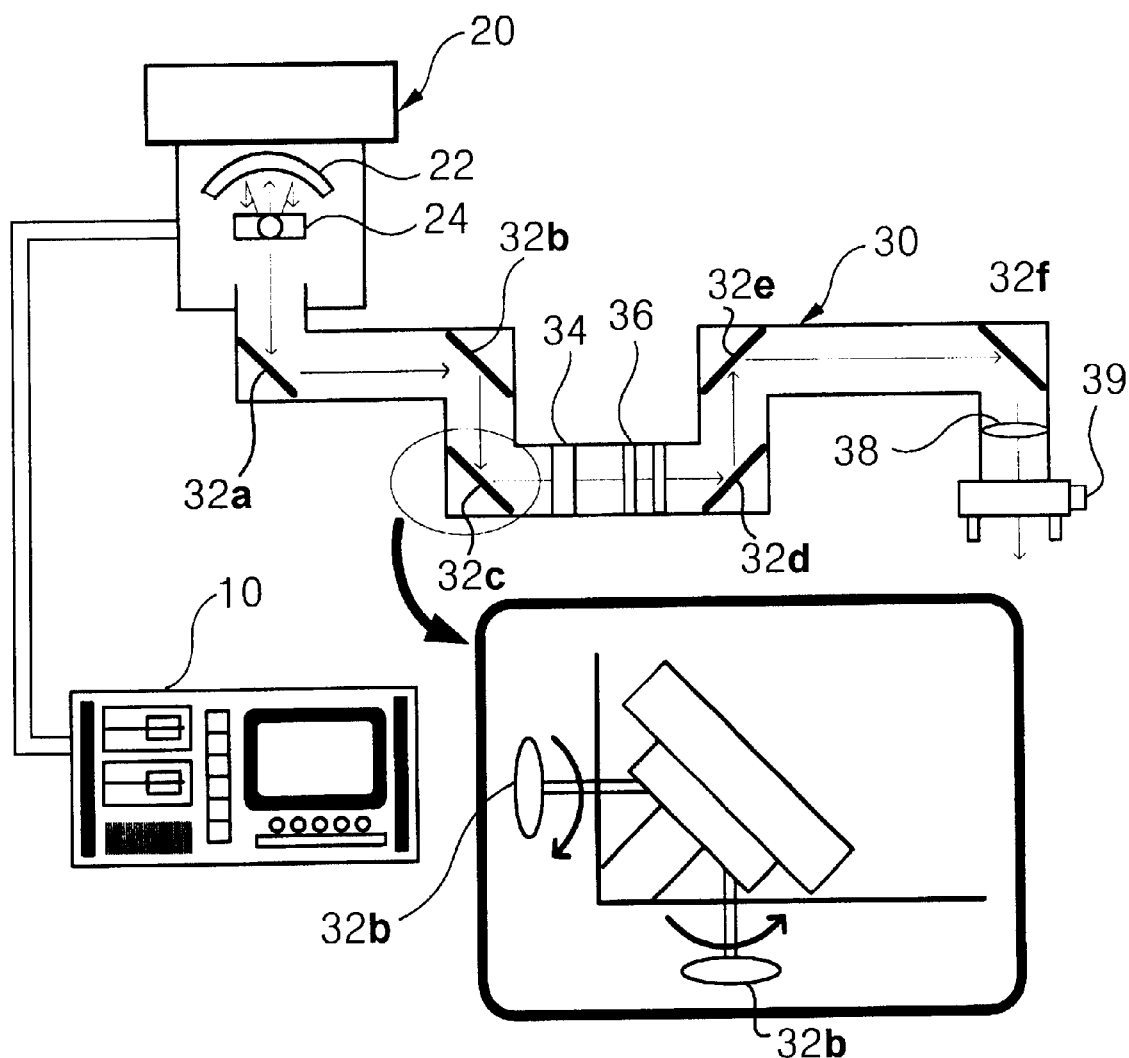
FIG. 4 is a view illustrating the details of a calibration-capable reflection mirror in the exposure apparatus described in FIG. 3.
Figure 5:
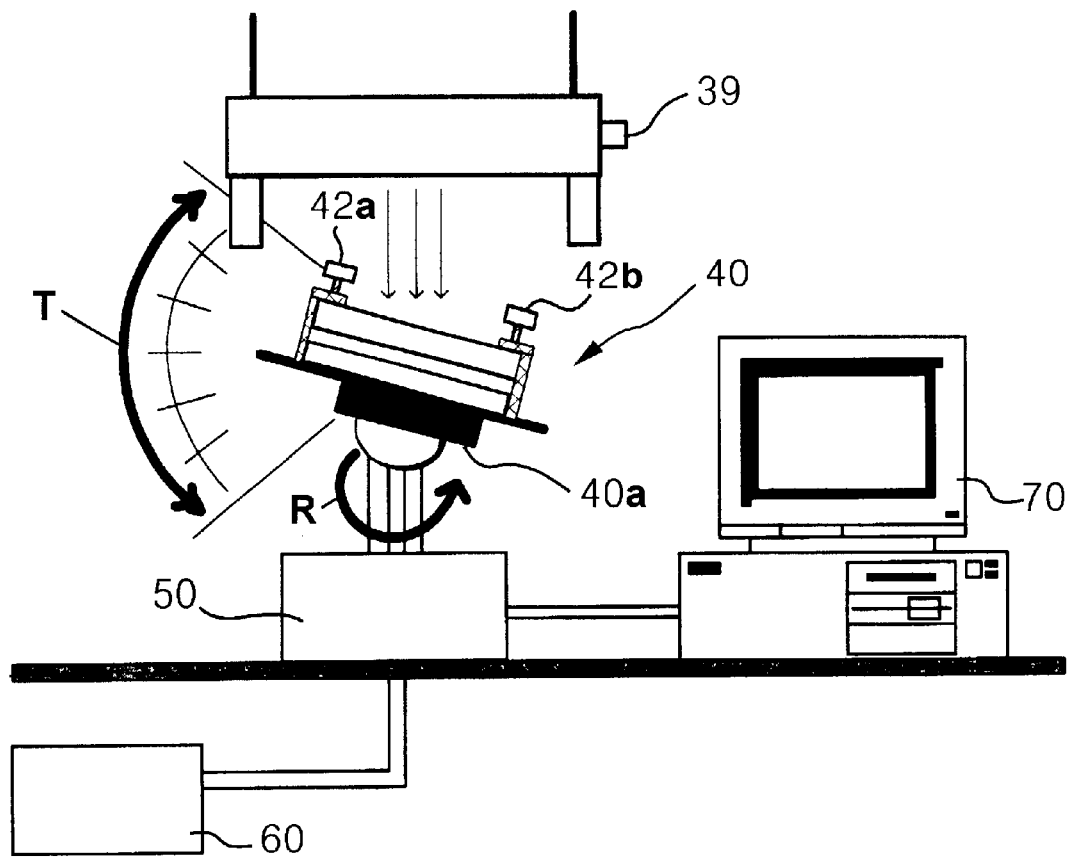
FIG. 5 is a view illustrating the structure of an extremely low-speed, inclined-rotating, exposure chuck in the exposure apparatus described in FIG. 3.
Figure 6:
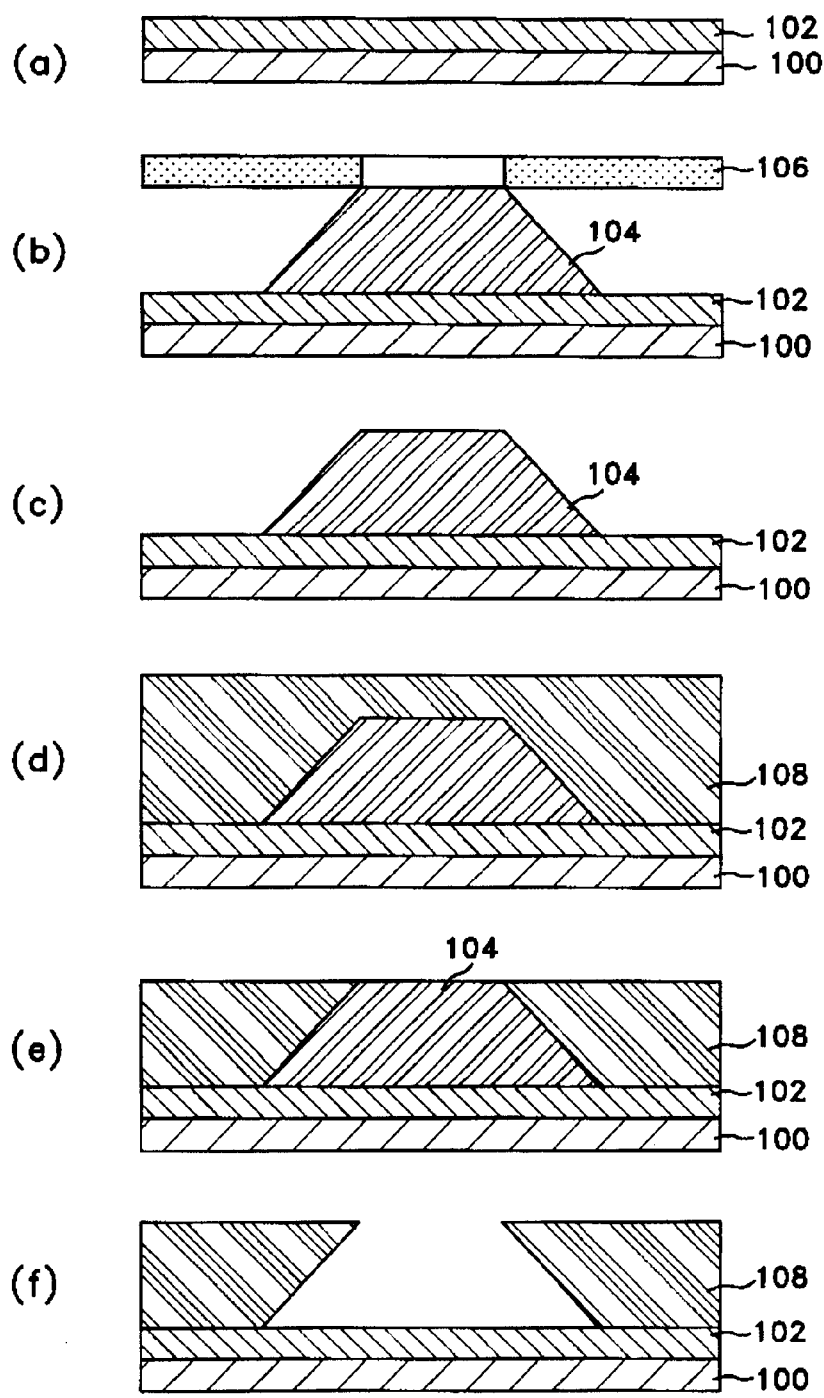
Figure 7:
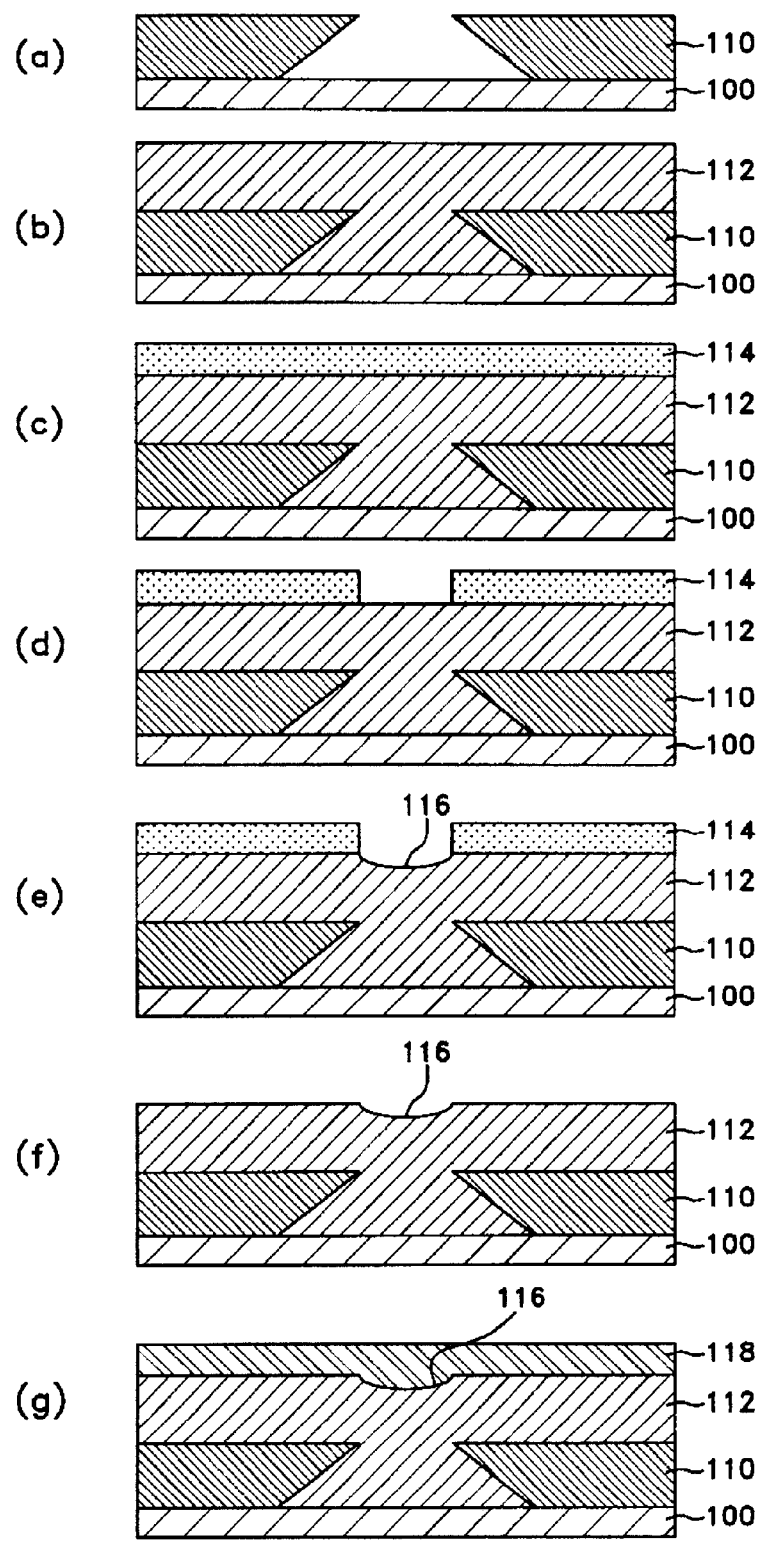
Figure 8:
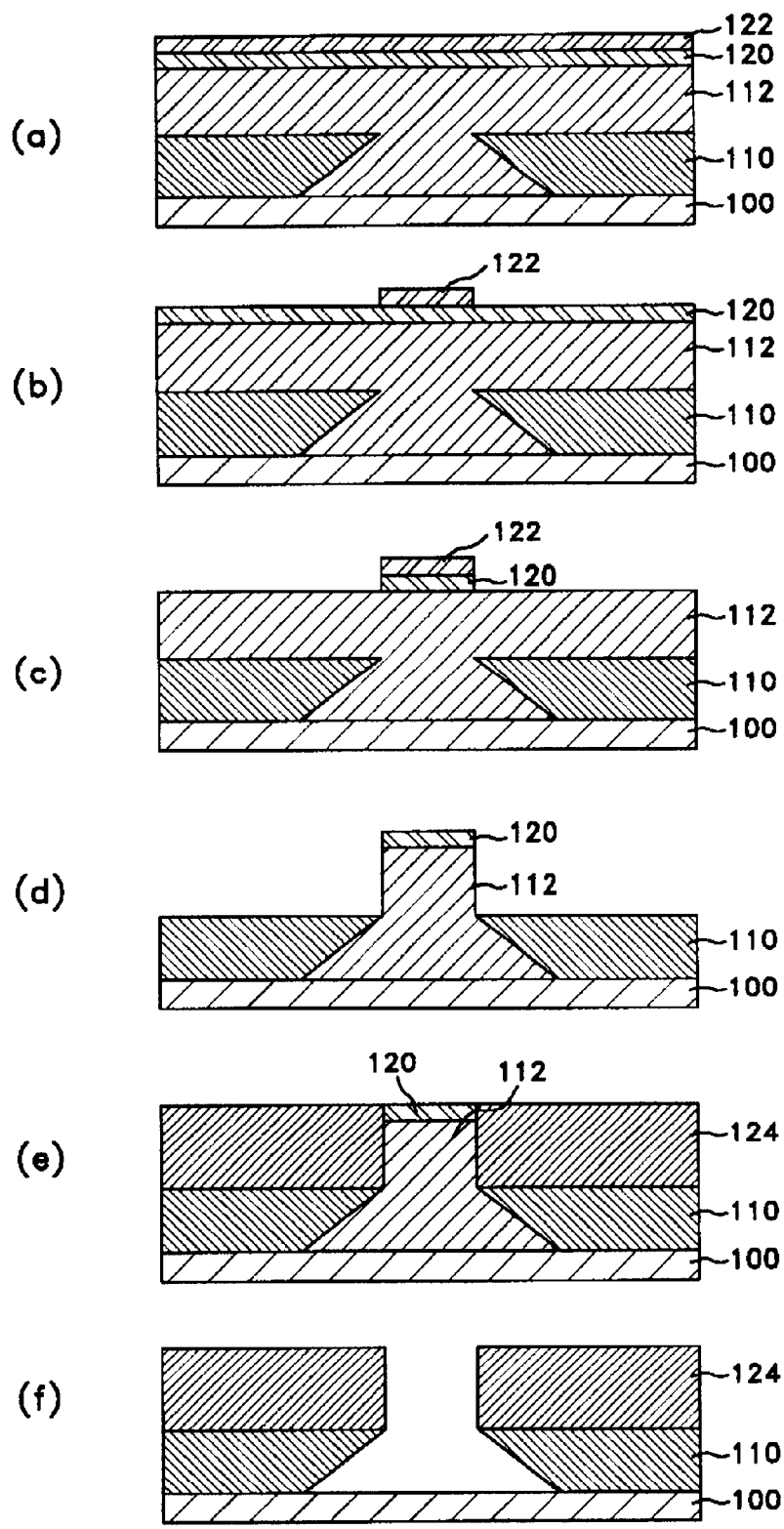

FIG. 3 is a view illustrating the overall structure of a mirror-reflection type, horizontal-structure, parallel exposure apparatus, in which an extremely low-speed, inclined-rotating, exposure chuck is installed, in accordance with the present invention. FIG. 4 is a view illustrating the details of a calibration-capable reflection mirror in the exposure apparatus described in FIG. 3, and FIG. 5 is a view illustrating the structure of an extremely low-speed, inclined-rotating, exposure chuck in the exposure apparatus described in FIG. 3.

Referring to FIG. 3, the system comprises: a power supply(10) to provide an electric power for actuating the exposure apparatus; a lamp cooler(20) to reflect the parallel light generated from a parallel light lamp; a mirror box(30) of the exposure apparatus having a certain horizontal/vertical length to obtain the parallel light output reflected by the lamp cooler(20) via numbers of reflecting mirrors; a chuck(40) that carries out an exposure process, by an extremely low-speed rotation in an inclined state, using the parallel light output through the mirror box(30) of the exposure apparatus; a motor(50) to actuate the chuck(40) to rotate in an extremely low-speed; a vacuum device(60) to maintain the vacuum state of the chuck(40); and a computer (70) to control the inclination, the rotational speed, and the rotation time of the chuck(40).

Referring to FIG. 4, the lamp cooler(20) comprises a reflecting shade(22) to reflect the parallel light and a parallel light lamp(24).

Inside the mirror box(30) of the parallel exposure apparatus connected to the lamp cooler(20), numbers of reflecting mirrors(32a, 32b, 32c, 32d, 32e, and 32f), a fly eye lens(34), a plate lens(36) and a collimating lens(38) are installed respectively. And, a shutter(39), which controls the exposure level of parallel light, is installed at the end of the mirror box(30).

In addition, mirror angle calibrators(32g), which calibrate the mirror angle, are installed at the reflecting mirrors(32a, 32b, 32c, 32d, 32e, and 32f).

Here, an excimer laser as well as an ultraviolet light can be used as a light source in the exposure apparatus, and the power of the light source can be controlled.

Referring to FIG. 5, the main body(40a) of the chuck(40) is equipped with fixing devices(42a, 42b) that unite a mask and a wafer at the body.

Thus, the chuck(40) carries out exposure process in an inclined state having a mask united on top of the wafer fixed at the main body(42a).

Here, the symbol T indicates the inclination range of the chuck(40) on which the mask and the wafer are united, and the symbol S indicates the rotation range of the chuck(40) on which the mask and the wafer are united.

Looking into the operation procedures of a parallel exposure apparatus having a mirror-reflection type horizontal structure as described before, when an electric actuating power is provided to the parallel exposure apparatus from a power supply(10), a lamp cooler(20) generates parallel light, and thereafter the parallel light outputs through numbers of reflecting mirrors(32a, 32b, 32c, 32d, 32e, and 32f) installed inside the mirror box(30) of the exposure apparatus.

Next, the chuck(40) of the exposure apparatus carries out exposure process, in the form of a mask united on top of the wafer, by the extremely low-speed rotational actuation by the low-speed motor(50) within the inclination/rotation range of the chuck.

FIG. 6a~FIG. 8f are views illustrating the manufacturing procedures of a horn-shaped 3-D micro-structure antenna in accordance with the present invention.

Referring to FIG. 6a and FIG. 6b, a sacrificial oxide film(102) is deposited on top of a semiconductor substrate (100). And then, the first photosensitive film(104) is coated on the sacrificial oxide film(102), and exposing/developing processes are carried out using an exposure mask(106) thereafter.

Here, a mask, at which a pattern is formed to lithograph the light only to the center portion, is used for the exposure mask(106).

Referring to FIG. 6c and FIG. 6d, after a pattern being formed on the first photosensitive film(104) by the exposing/developing processes, the first metal film(108) is deposited thereon, with a thickness enough for covering the pattern of the first photosensitive film(104), by using an electroless plating technique.

Here, the pattern of the first photosensitive film(104) has a horn-shaped structure.

Referring to FIG. 6e and FIG. 6f, after being deposited, the first metal film(108) is polished by chemical/mechanical polishing(CMP) process until the upper surface of the pattern of the first photosensitive film(104) comes out. And thereafter, the horn-shaped pattern of the first photosensitive film(104) is eliminated by plasma asher process.

Next, the first metal film(108) is polished by CMP process to have a designated thickness to constitute a horn-shaped micro-structure.

And, referring to FIG. 7a and FIG. 7b, after a horn-shaped micro-structure(110) is constituted by the sacrificial oxide film(102) being separated and eliminated, a polymer thick film(112) is deposited thereon.

Here, the polymer thick film(112) is deposited up to a thickness enough to cover the whole space where the eliminated first photosensitive film(104) pattern existed.

Next, referring to FIG. 7c and FIG. 7d, the second photosensitive film(114) is coated thereon, and thereafter a pattern of the second photosensitive film(114) is formed by patterning process using a mask(not described in the figure) at which a pattern is formed to lithograph the light only to the center portion.

And then, referring to FIG. 7e and FIG. 7f, a round(116) is formed at the surface of the polymer thick film(112), exposed by the pattern of the second photosensitive film (114), by performing dry etching process on the whole surface. Thereafter, the second photosensitive film(114) pattern is eliminated.

Next, referring to FIG. 7g, the second metal film(118) is deposited thereon, and thereafter a polishing process is performed, using CMP process, until the round(116) of the second metal film(118) is eliminated.

Next, referring to FIG. 8a and FIG. 8b, the third metal film(120) is deposited thereon, and the third photosensitive film(122) is coated on the third metal film(120). And then, a pattern of the third photosensitive film(122) is formed by patterning process by which the pattern is formed only at the portion designated to be a waveguide of 3-D antenna.

Next, referring to FIG. 8c, and FIG. 8d, a pattern of the third metal film(120) is formed to be superposed on the pattern of the third photosensitive film(122) by patterning process in which the pattern of the third photosensitive film(122) is used as an etching barrier.

Next, referring to FIG. 8e, and FIG. 8f, the pattern of the third photosensitive film(122) is eliminated, and thereafter a pattern of polymer thick film(112) is formed by an oxidative anisotropic etching process in which the pattern of the third metal film(118) is used as an etching barrier.

Next, the fourth metal film(124) is deposited thereon using an electroless plating technique. Thereafter, a 3-D micro-structure antenna is finally produced by eliminating the pattern of the third metal film(120) and the pattern of the polymer thick film(112) from the semiconductor substrate (100) by plasma asher process.

As mentioned thereinbefore, an extremely low-speed, inclined-rotating, parallel exposure apparatus and method for manufacturing 3-D micro-structure antenna using the exposure apparatus in accordance with the present invention have the following advantages:

First, the present invention can be applied to manufacturing a horn-shaped 3-D micro-structure antenna array, which can not be manufactured easily by prior MEMS process.

Second, the present invention provides a method of reducing the size of an exposure apparatus by constructing a horizontal-structure mirror box using reflection of mirrors installed inside, to overcome the comparably-high vertical length of the mirror box to obtain parallel light in the prior exposure apparatus. Thus, experiment can be easily performed in a general experimental room.

Third, the exposure apparatus in accordance with the present invention can be applied to manufacturing various types of 3-D micro-structures because it can control the inclination, the rotational speed, and the rotation time of the chuck on which a mask and a wafer are united.

Since those having ordinary knowledge and skill in the art of the present invention will recognize additional modifications and applications within the scope thereof, the present invention is not limited to the embodiments and drawings described above.

What is claimed is:

1. An exposure apparatus comprising:
   a power supply to provide an electric power for actuating the exposure apparatus;
   a lamp cooler to reflect the parallel light generated from a parallel light lamp;
   a mirror box of the exposure apparatus having a certain horizontal/vertical length to obtain the parallel light output reflected by said lamp cooler via numbers of reflecting mirrors;
   a chuck that carries out an exposure process, by an extremely low-speed rotation in an inclined state, using the parallel light output through said mirror box of the exposure apparatus;
   a motor to accurate said chuck to rotate in an extremely low-speed;
   a vacuum device to maintain the vacuum state of said chuck; and
   a computer to control the range of the extremely low-speed rotational state of said chuck.

2. An exposure apparatus as claimed in claim 1, wherein each of said numbers of reflecting mirrors equipped in said mirror box further comprises mirror angle calibrators that calibrate the mirror angle.

3. An exposure apparatus as claimed in claim 1, wherein a collimating lens is installed inside said mirror box of the exposure apparatus.

4. An exposure apparatus as claimed in claim 1, characterized in that said chuck carries out exposure process in an inclined state having a mask united on top of the wafer fixed at the main body.

5. An exposure apparatus as claimed in claim 1, characterized in that said computer controls the inclination, the rotational speed, and the rotation time of said chuck.

6. An exposure apparatus as claimed in claim 1, wherein said exposure apparatus uses an ultraviolet light or an excimer laser as a light source.

7. An exposure apparatus as claimed in claim 1, characterized in that the power of the light source being exposed in said exposure apparatus can be controlled.

8. A method for manufacturing 3-D micro-structure antenna using an exposure apparatus comprising:
   depositing sacrificial oxide film on top of a semiconductor substrate;
   forming a pattern of the first photosensitive film having horn-shaped structure on top of said sacrificial oxide film;
   depositing the first metal film thereon up to a thickness enough for covering said pattern of the first photosensitive film;
   polishing said first metal film by chemical/mechanical polishing(CMP) process until the upper surface of said pattern of the first photosensitive film comes out;
   eliminating said horn-shaped pattern of said first photosensitive film;
   forming a horn-shaped micro-structure by separating/eliminating said sacrificial oxide film, and thereafter depositing polymer thick film thereon;
   forming a pattern of the second photosensitive film on top of said polymer thick film by patterning process using a mask at which a pattern is formed to lithograph the light only to the center portion;
   forming a round at the surface of said polymer thick film, exposed by said pattern of said second photosensitive film, by dry etching process;
   depositing the second metal film thereon, and thereafter polishing the surface, using CMP process, until the round of said second metal film is eliminated;
   depositing the third metal film thereon, and thereafter forming a pattern of the third photosensitive film only at the portion, designated to be a horn-shaped waveguide, of the surface;
   forming a pattern of said third metal film to be superposed on the pattern of said third photosensitive film by patterning process in which the pattern of said third photosensitive film is used as an etching barrier;
   eliminating the pattern of said third photosensitive film, and thereafter forming a pattern of polymer thick film by etching process in which the pattern of said third metal film is used as an etching barrier; and
   depositing the fourth metal film thereon using an electroless plating technique, and thereafter eliminating the pattern of said third metal film and the pattern of said polymer thick film from said semiconductor substrate by plasma asher process.

9. A method for manufacturing 3-D micro-structure antenna using an exposure apparatus as claimed in claim 8, characterized in that said first metal film is deposited up to a thickness enough for covering the pattern of said first photosensitive film by using an electroless plating technique.

10. A method for manufacturing 3-D micro-structure antenna using an exposure apparatus as claimed in claim 8, characterized in that said horn-shaped pattern of said first photosensitive film is eliminated by using plasma asher process.

11. A method for manufacturing 3-D micro-structure antenna using an exposure apparatus as claimed in claim 8, characterized in that the pattern of said polymer thick film is formed, after eliminating the pattern of said third photosensitive film, by using an oxidative anisotropic etching process in which the pattern of said metal film is used as an etching barrier.

12. An exposure apparatus as claimed in claim 2, wherein a collimating lens is installed inside said mirror box of the exposure apparatus.

* * * * *

UNITED STATES PATENT AND TRADEMARK OFFICE
CERTIFICATE OF CORRECTION

PATENT NO. : 6,589,434 B2
DATED : July 8, 2003
INVENTOR(S) : S. Moon et al.

It is certified that error appears in the above-identified patent and that said Letters Patent is hereby corrected as shown below:

<u>Title page,</u>
Item [73], Assignee, before "Institute" insert -- Korea --.

<u>Column 5,</u>
Line 36, change "accurate" to -- actuate --.

Signed and Sealed this

Second Day of March, 2004

JON W. DUDAS
*Acting Director of the United States Patent and Trademark Office*